United States Patent
Sharma et al.

(10) Patent No.: US 9,442,839 B1
(45) Date of Patent: Sep. 13, 2016

(54) NONVOLATILE STORAGE WITH AUTOMATED RESPONSE TO PROGRAM FAULTS

(71) Applicant: SANDISK TECHNOLOGIES INC., Plano, TX (US)

(72) Inventors: Aditya Pratap Sharma, Bangalore (IN); N. Balasiva Kumar, Andhra Pradesh (IN); Vimal Kumar Jain, Bangalore (IN)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/721,193

(22) Filed: May 26, 2015

(51) Int. Cl.
| | |
|---|---|
| *G06F 12/02* | (2006.01) |
| *G11C 29/00* | (2006.01) |
| *G11C 16/10* | (2006.01) |
| *G11C 16/08* | (2006.01) |
| *G11C 29/08* | (2006.01) |

(52) U.S. Cl.
CPC .......... *G06F 12/0238* (2013.01); *G11C 16/08* (2013.01); *G11C 16/10* (2013.01); *G11C 16/102* (2013.01); *G11C 29/08* (2013.01); *G11C 29/76* (2013.01)

(58) Field of Classification Search
CPC . G06F 12/0238; G11C 16/102; G11C 29/76; G11C 16/10; G11C 29/08; G11C 16/08
See application file for complete search history.

(56) References Cited

U.S. PATENT DOCUMENTS

| | | | |
|---|---|---|---|
| 6,601,132 B2 | 7/2003 | Nomura | |
| 7,405,976 B2 | 7/2008 | Hebishima | |
| 8,341,332 B2 | 12/2012 | Ma | |
| 8,397,024 B2 | 3/2013 | Fasoli | |
| 8,619,493 B2 | 12/2013 | Kim | |
| 8,788,880 B1 | 7/2014 | Gosla | |
| 2002/0191459 A1 | 12/2002 | Tsujikawa | |
| 2003/0037278 A1* | 2/2003 | Olarig | G11C 29/76 714/5.1 |
| 2007/0101096 A1 | 5/2007 | Gorobets | |
| 2010/0106893 A1* | 4/2010 | Fasoli | G11C 16/102 711/103 |
| 2010/0142275 A1* | 6/2010 | Yogev | G06F 12/0238 365/185.09 |
| 2011/0296133 A1 | 12/2011 | Flynn | |
| 2014/0047168 A1 | 2/2014 | Kim | |
| 2014/0208156 A1 | 7/2014 | Muralimanohar | |
| 2014/0215122 A1 | 7/2014 | Li | |
| 2014/0258590 A1 | 9/2014 | Kochar | |
| 2015/0046625 A1* | 2/2015 | Peddle | G11C 16/10 710/308 |
| 2015/0058537 A1 | 2/2015 | Shen | |

* cited by examiner

*Primary Examiner* — Richard Elms
*Assistant Examiner* — Ajay Ojha
(74) *Attorney, Agent, or Firm* — Vierra Magen Marcus LLP

(57) ABSTRACT

A non-volatile storage system comprises a controller and one or more memory die in communication with the controller. The controller sends data and an initial address in conjunction with a request to program the data to one of the memory die. The memory die comprises a plurality of non-volatile storage elements and one or more control circuits. The one or more control circuits attempt to program the data to the non-volatile storage elements at the initial address and determine that programming of the data at the initial address fails. The one or more managing circuits automatically identify a new address in the memory die without the memory die being instructed of the new address by the controller and program the data at the new address on the memory die without the data being re-transmitted from the controller to the memory die.

21 Claims, 14 Drawing Sheets number of cells

E

Fig. 11A $V_T$ number of cells

E     IM $V_{vIM}$

Fig. 11B $V_T$

E     IM number of cells

S0   S1   S2   S3   S4   S5   S6   S7
   $V_{v1'}$ $V_{v2'}$ $V_{v3'}$ $V_{v4'}$ $V_{v5'}$ $V_{v6'}$ $V_{v7'}$

Fig. 11C $V_T$ number of cells

S0   S1   S2   S3   S4   S5   S6   S7
   $V_{v1}$ $V_{v2}$ $V_{v3}$ $V_{v4}$ $V_{v5}$ $V_{v6}$ $V_{v7}$

Fig. 11D $V_T$ number of cells

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

NONVOLATILE STORAGE WITH AUTOMATED RESPONSE TO PROGRAM FAULTS

BACKGROUND

Semiconductor memory devices have become more popular for use in various electronic devices. For example, non-volatile semiconductor memory is used in cellular telephones, digital cameras, personal digital assistants, mobile computing devices, non-mobile computing devices, servers and other devices. Electrical Erasable Programmable Read Only Memory (EEPROM) and flash memory are among the most popular non-volatile semiconductor memories.

Certain EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state (or multi-level) flash memory cell is implemented by identifying multiple, distinct allowed voltage ranges. Each distinct voltage range corresponds to a predetermined value for the set of data bits. The specific relationship between the data programmed into the memory cell and the voltage ranges of the memory cell depends upon the data encoding scheme adopted for the memory cells.

In addition to the gains in capacity resulting from multi-state memory architectures, consumers have seen significant advantages as a result of a history of steadily scaling down the physical dimensions of memory cells. Smaller memory cells can be packed more densely on a given die area, allowing the user to access more memory capacity for the same price as an older memory technology. The shrinking of gate areas decreases the floating-gate-to-substrate capacitance as well as the control-gate-to-floating-gate capacitance. This decrease in capacitance in turn requires less charge for programming and erasing cells, thus consuming less power. The decrease in charge required for programming and erasing cells also means that, for similar charging and discharging currents, programming and erasing operations can be performed more quickly.

However, scaling the sizes of memory cells entails certain risks. As stated above, in order to achieve the advantage of higher memory capacity for a fixed die size, these smaller cells must be packed more closely together. Doing so, however, may result in a greater number of manufacturing errors, such as shorting between the word lines, broken word lines and defective memory cells. Such errors can corrupt data stored on pages on the word lines being programmed. In some cases, these defects are not be realized during tests conducted by manufacturers prior to packaging and shipping. Rather, these defects only begin to corrupt data after program-erase cycles performed by the user.

In some prior systems, when an error was detected during programming, the data to be programmed was re-programmed in a new physical page or block. In addition, all of the data from the old block was moved to the new block. This process can be time consuming.

In another system, data is programmed to two more different blocks so that if one of the programming process fails, data can be recovered from the other block. This process requires more burden managing the multiple blocks of data and can also be time consuming.

BRIEF DESCRIPTION OF THE DRAWINGS

FIGS. 11A-E show various threshold voltage distributions and describe a process for programming non-volatile memory.

DETAILED DESCRIPTION

A non-volatile storage system is proposed that recovers from programming errors in a more efficient manner. If an error occurs during programming, the programming process can automatically advance to a next available word line, page or other unit in the same block (or other unit of storage), without requiring a re-transmission of data, address, or command.

One example system includes a controller and one or more memory die in communication with the controller. The controller sends data and an initial address in conjunction with a request to program the data to one of the memory die.

The memory die comprises a plurality of non-volatile storage elements and one or more control circuits. The one or more control circuits attempt to program the data to the non-volatile storage elements at the initial address and determine that programming of the data at the initial address fails. The one or more control circuits automatically identify a new address in the memory die without the memory die being instructed of the new address by the controller and program the data at the new address on the memory die without the data being re-transmitted from the controller to the memory die. In one embodiment, the new address is any address other than the initial address. The memory die reports the successful programming of the data to the controller, and identifies the new address for the successfully programmed data. In response, the controller will mark the initial address as a bad address and create a translation of a system address to the new address so that future read commands of the data will be able to locate and access the data. Note that in this example, the memory die updated the programming address and re-tried the programming without receiving a re-transmission of the first data and without receiving the adjusted programming address from a source external to the memory die (e.g., from the controller).

Figure 1A:
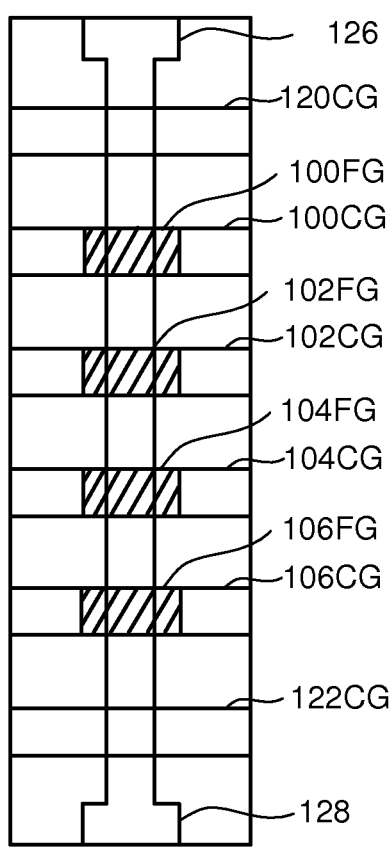
FIG. 1A is a top view of a NAND string.
Figure 1B:
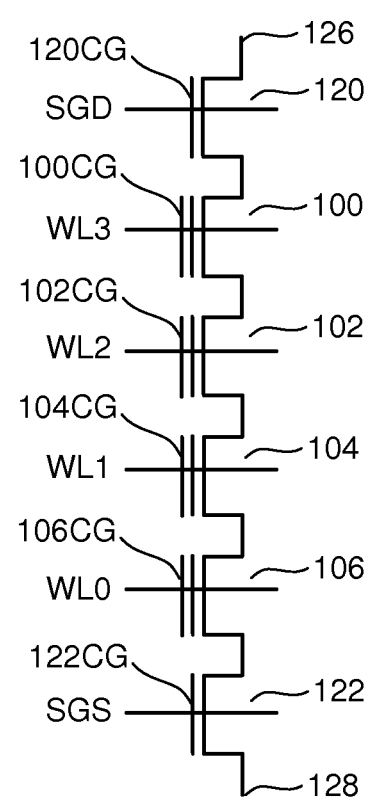
FIG. 1B is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1A and 1B show four memory cells in the NAND string, the use of four memory cells is only provided as an example. A NAND string can have less than four memory cells or more than four memory cells. For example, some NAND strings will have 128 memory cells, 256 memory cells, or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Traditionally, NAND flash memory is implemented as a two dimensional memory structure. However, NAND technology can also be implemented as a three dimensional memory structure. One embodiment of a three dimensional memory structure suitable for use with the present technology is a monolithic three dimensional memory structure.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The technology described herein can be used with two and three dimensional memory structures.

A charge-trapping material can also be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. Examples of BiCS architecture three dimensional structures can be found in U.S. Pat. No. 8,879,333. These BiCS architecture three dimensional structures can be used to implement the technology described herein.

Figure 2:
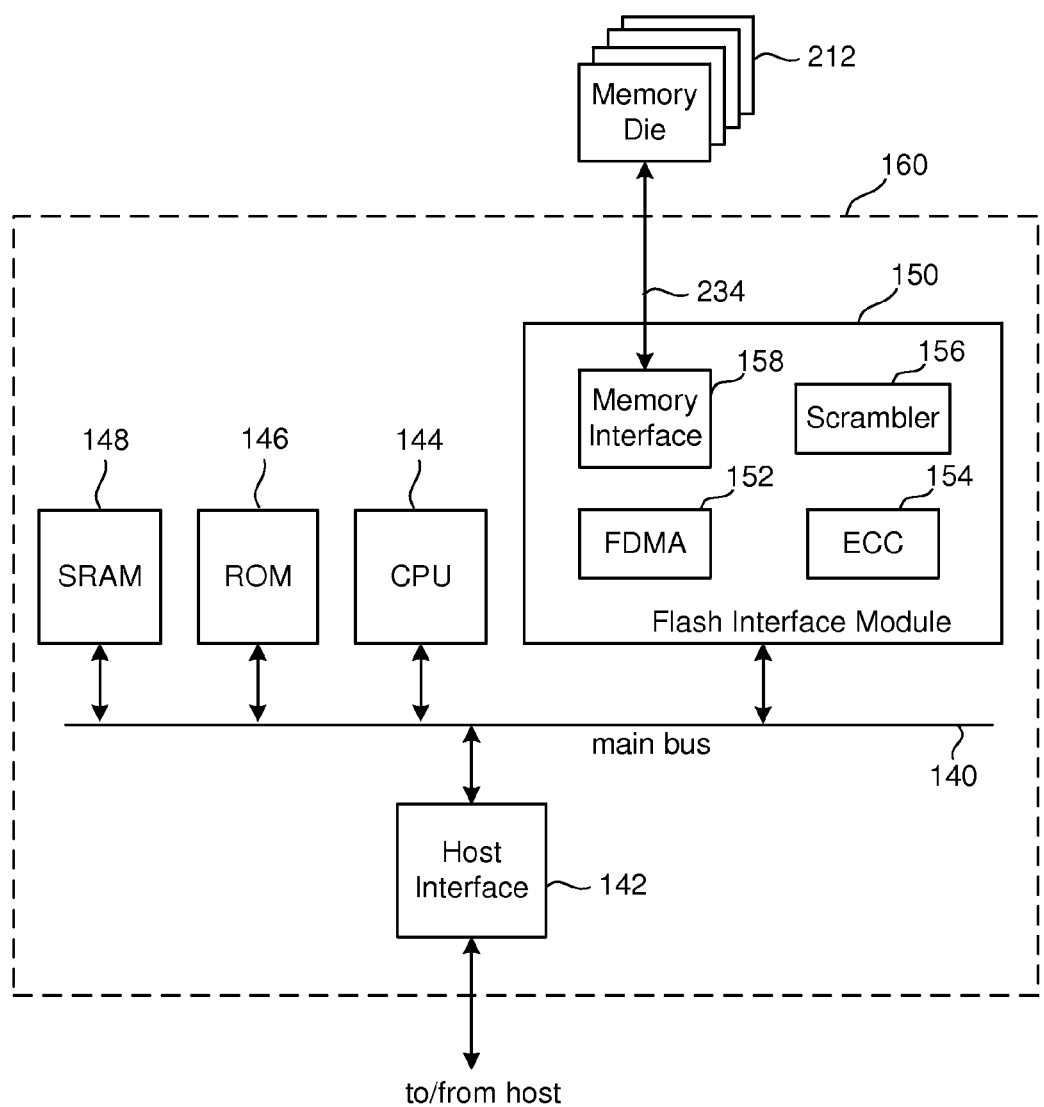
FIG. 2 is a block diagram of an example non-volatile memory system.

FIG. 2 is a block diagram of one embodiment of a nonvolatile memory system. Depicted is a main bus 140 in communication with host interface 142, CPU 144, ROM 146, SRAM 148 and Flash Interface Module 150. Host interface provides interface between the components of FIG. 2 (the nonvolatile memory system) and a host. Examples of a host can include a desktop computer, laptop computer, tablet, cellular phone, mobile computing device, smart appliance, etc. CPU 144 is a processor (single or multi core). ROM 146 can include any type of known read-only memory. In one embodiment, ROM 146 is used to store firmware or other software for programming CPU 144. SRAM 148 is used as a re-writable main memory for CPU 144. Flash Interface Module 150 provides interface between the components connected to main bus 144 and one or more memory die 212. In one embodiment, the components of FIG. 2 can be packaged in a card, on a printed circuit board, or embedded in a computing system or appliance. Flash Interface Module 150 includes a Flash Direct Memory Addressing Module 152, ECC Engine 154, Scrambler 156 and Memory Interface 158. Flash direct Memory Addressing Module 152 provides for directly addressing data inside the memory (e.g., any of the one or more memory die 212). ECC Engine 154 provides error correction, as discussed below. Scrambler 156 is used to scramble the data prior to programming and de-scramble after reading in order to provide wear leveling to the one or more memory die 212. Memory Interface 158 provides interface to the one or more memory die 212. In one embodiment all the components inside dashed line 160 (including components 140, 142, 144, 146, 148, 150, 152, 154, 156 and 158) comprise a controller (hereinafter referred to as controller 160). In some embodiments, the controller can include less than all the components depicted inside dashed line 160.

Figure 3:
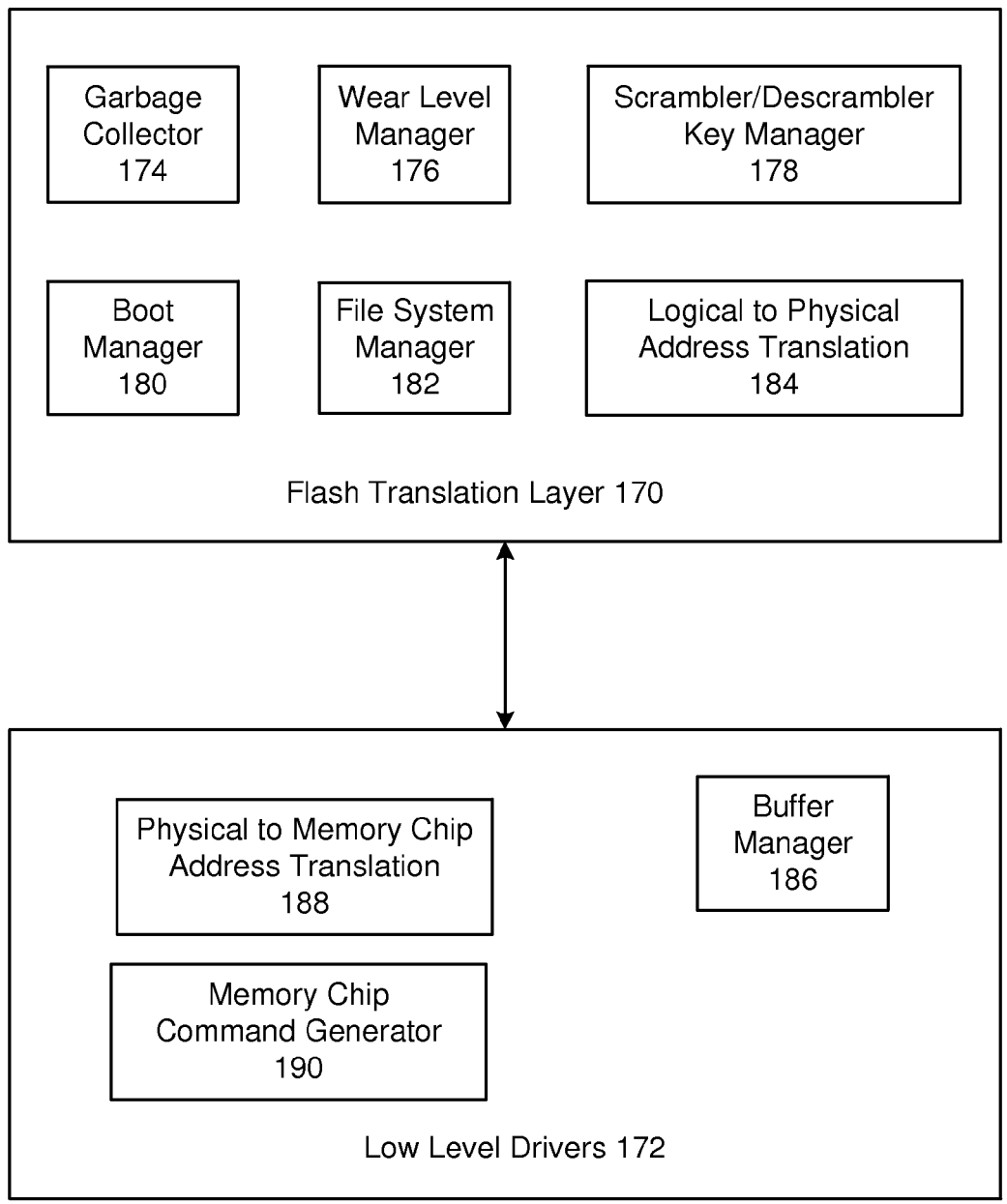
FIG. 3 is a block diagram that depicts example software modules of a system using non-volatile memory.

FIG. 3 is a block diagram that depicts examples of software modules implemented on controller 160 of FIG. 2. For example, these software modules can be used to program CPU 144. FIG. 3 shows a Flash Translation Layer 170 and Low Level Drivers 172. The Flash Translation Layer 170 includes Garbage Collector 174, Wear Level Manager 176, Scrambler/De-scrambler Key Manager 178, Boot Manager 180, File System Manager 182, and Logical to Physical Address Translation 184. Garbage Collector 174 is used to remove discarded data and rearrange the still valid data stored in the memory to make more efficient use in the memory capacity. Wear Level Manager 176 is used to manage the use of the one or more memory die 212 such that the programming and erasing cycles are performed as evenly as possible throughout the memory space. Scrambler/De-scrambler Key Manager 178 is used to scramble and de-scramble data, and stored the keys used for the scrambling and de-scrambling. Boot Manager 180 provides code for booting up controller 160. File System Manager 182 manages the file system used to store user data on the various memory die. Logical to Physical Address Translation 184 provides a translation between logical addresses received from the host and physical (system) addresses across the memory space.

Low Level Drivers 172 include Buffer Manager 186, Physical to Memory Chip Address Translation 188 and Memory Chip Command Generator 190. controller 160 includes a buffer for which data is stored prior to being programmed. That buffer can reside in SRAM 148 or in a separate memory buffer. Buffer Manager 186 is used to manage that buffer. While data is in the buffer, the data can be subjected to scrambling as well as error correction. Physical to Memory Chip Address Translation provides a translation between the physical address and a particular address on the memory chip chosen to store the data. In one embodiment, Physical to Memory Chip Address Translation 188 can include a table that shows the translation between physical addresses (also called the system address) and the memory chip address. Memory Chip Command Generator 190 is used to provide commands in the various memory die 212 in order to invoke programming, reading, erasing, etc.

Figure 4:
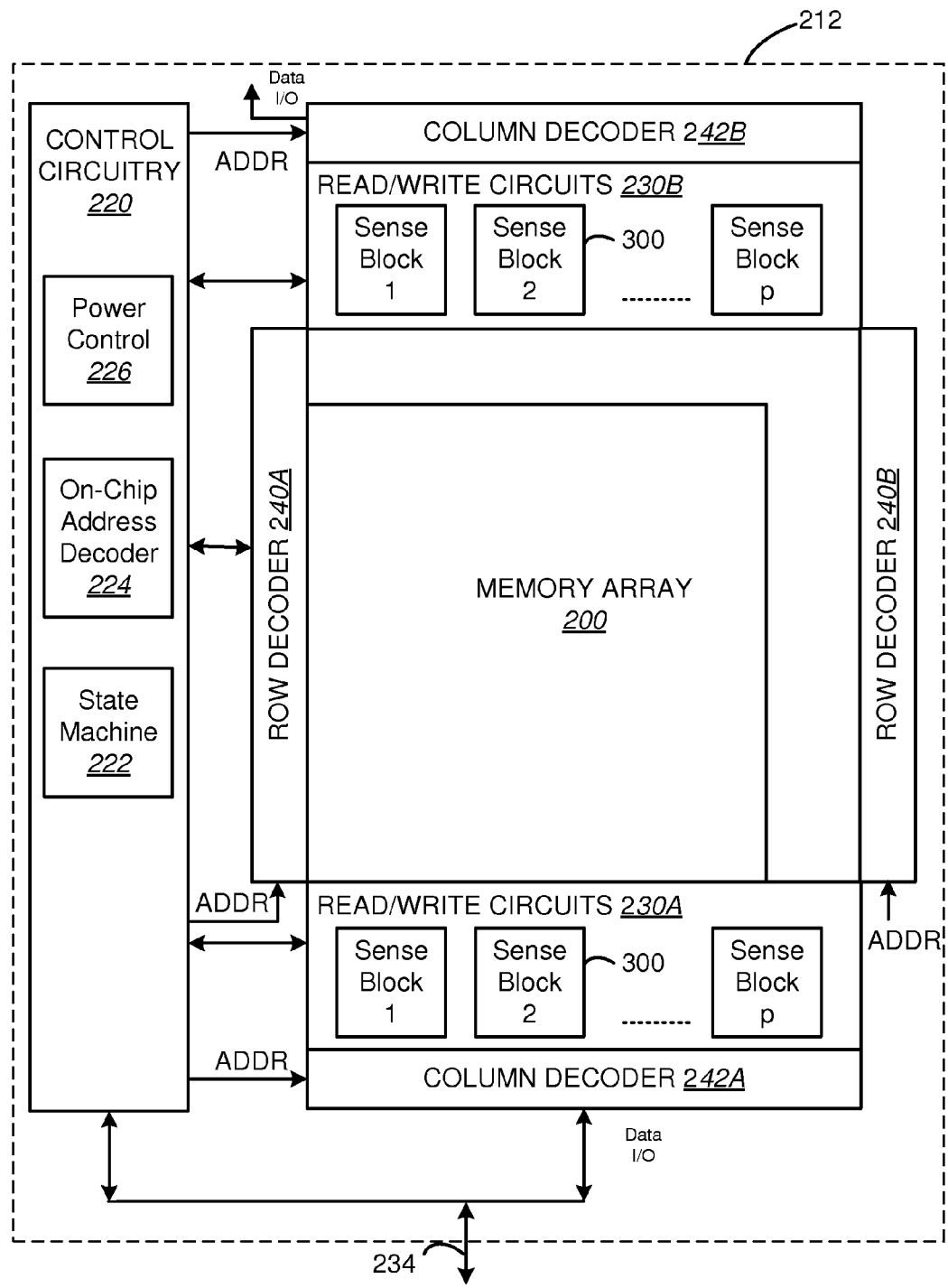
FIG. 4 is a block diagram of an example memory die.

FIG. 4 illustrates a memory device 212 having read/write circuits for reading and programming a page of memory cells (e.g., NAND multi-state flash memory) in parallel. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 160 is in communication with the memory die 212. Commands and data are transferred between the memory die 212 and controller 244 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 160, collectively or separately, can be referred to as one or more managing circuits or one or more control circuits.

In one embodiment, the host is a computing device (e.g., laptop, desktop, smartphone, tablet, digital camera, etc.) that includes one or more processors, one or more processor readable storage devices (RAM, ROM, flash memory, hard disk drive, etc.) that store processor readable code (e.g., software) for programming the one or more processors to perform the methods described herein. The host may also include additional system memory, one or more input/output interfaces and/or one or more input/output devices in communication with the one or more processors.

In one embodiment, state machine 222 may be fully implemented in hardware. In another embodiment, state machine 222 may be implemented in a combination of hardware and software. For example, state machine 222 may include one or more processors and one or more processor readable storage devices (RAM, ROM, flash memory, hard disk drive, etc.) that store processor readable code (e.g., software) for programming the one or more processors to perform the methods described herein.

Figure 5:
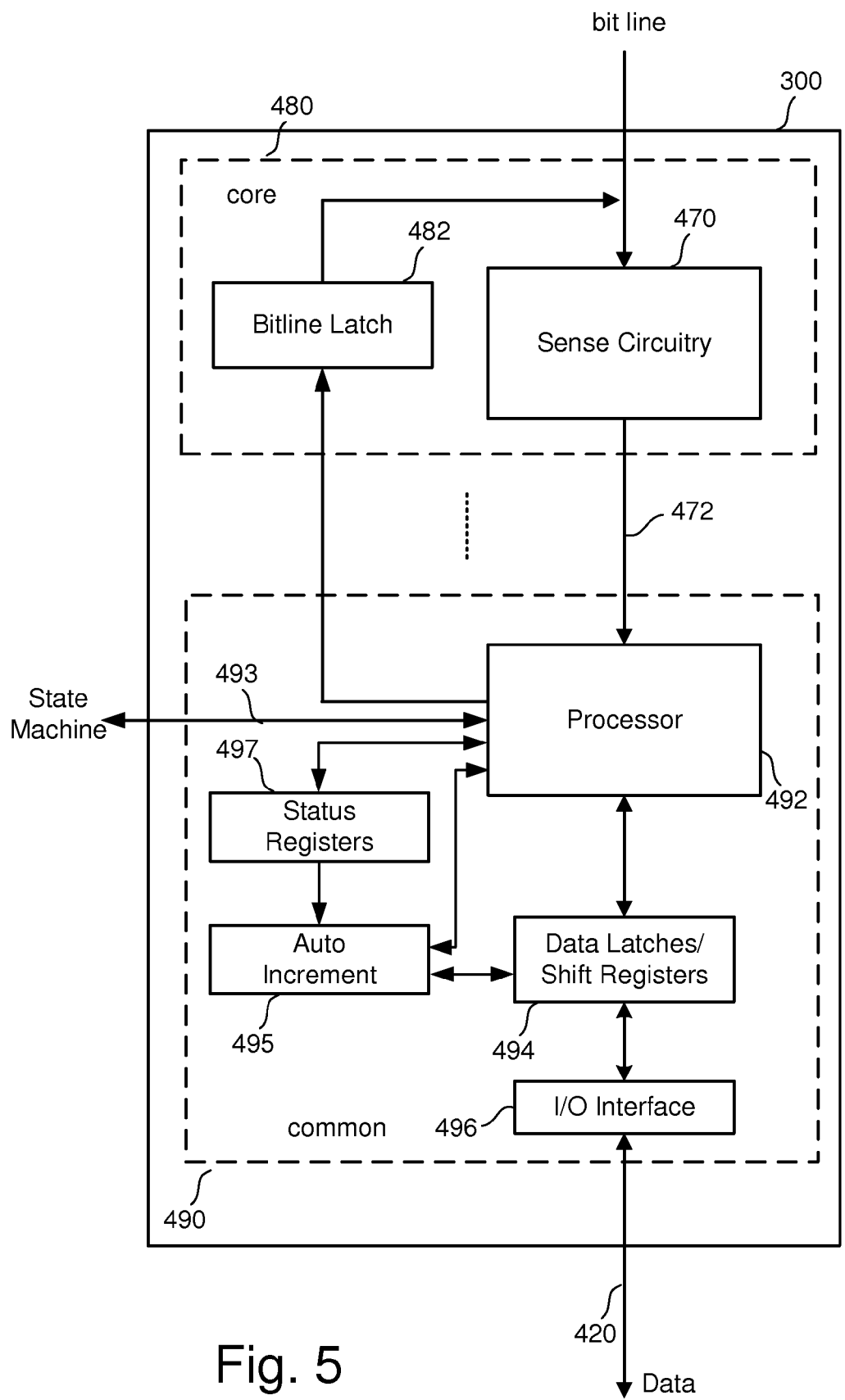
FIG. 5 is a block diagram of an example sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of functions of processor 492 is to determine the data stored in the sensed memory cell and store the determined data in the set of data latches. The set of data latches 494 is used to store data bits determined by processor 492 during a read operation. Processor 492 is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells so that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments, processor 492 initially loads the bit line latch 482 and the sense circuitry sets it to an inhibit value during the verify process.

Data latch/shift registers stack 494 contains a stack of data latches and/or shift registers corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches/shift registers corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

FIG. 5 also shows status registers 497, which indicates the status for the memory operations being performed, such as programming and reading. The content of the status registers can be set and read by Processor 492, and provided to the State Machine via signal lines 493. FIG. 5 also shows an automatic increment circuit 495 that receives the output of the status registers 497. Automatic increment circuit 495 is in bidirectional communication with processor 492, so that automatic increment circuit 495 can automatically increment an address being used for programming when a program fault occurs. In one embodiment, automatic increment circuit 495 will increment a programming address to an address for the next word line or an address for the next page. More details are explained below. A programming address can be an identification of a word line, a word line offset, an identification of a page (physical, logical or ECC), a page offset, a specific set of one or more memory cells, etc. The exact format of the programming address can vary by specific implementation.

Figure 6:
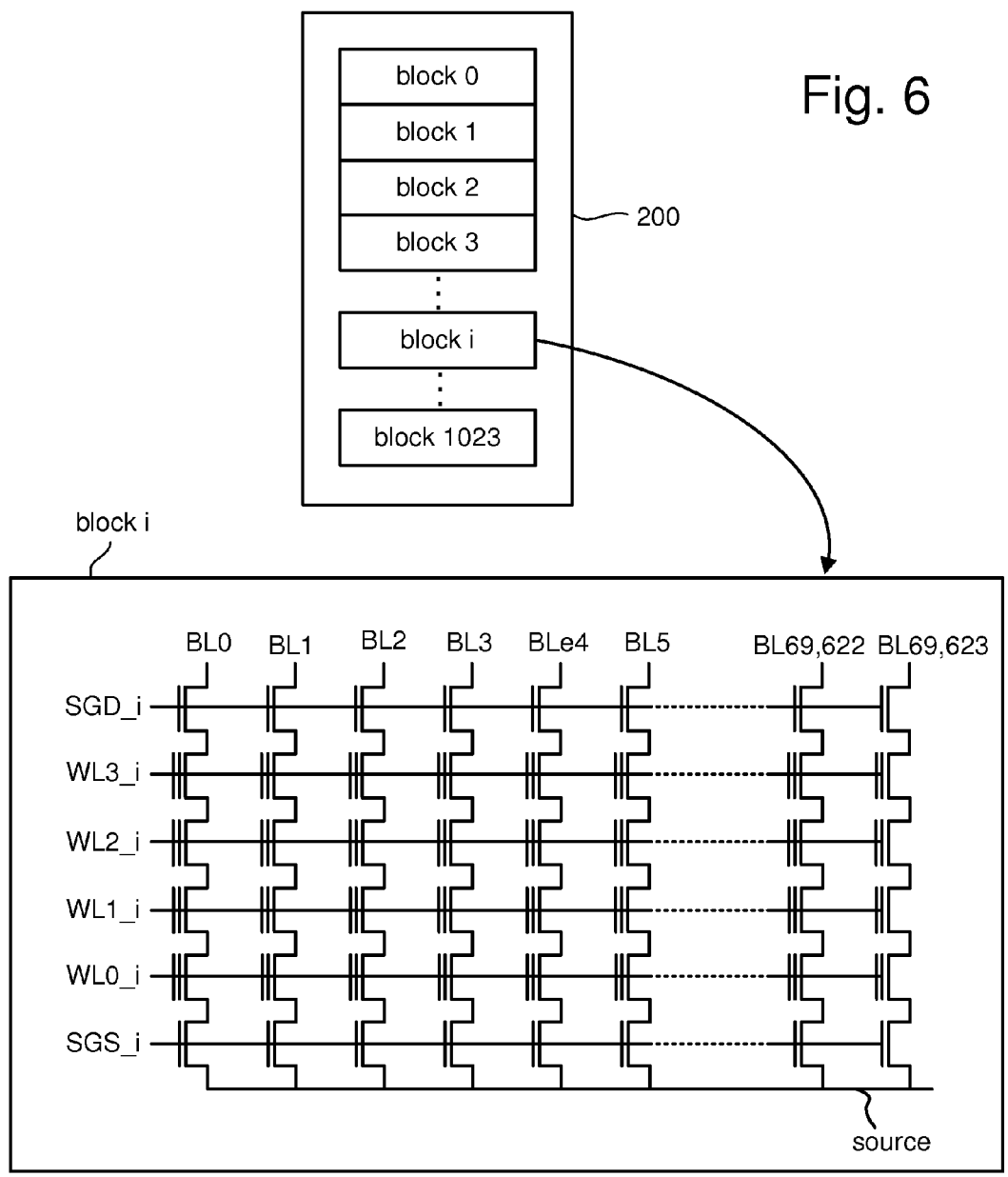
FIG. 6 depicts an exemplary structure of a memory cell array.

FIG. 6 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used in other embodiments. In each block, in this example, there are 69,624 columns corresponding to bit lines BL0, BL1, . . . BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 6 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells, with one row of memory cells being connected to a word line. A page can store one or more sectors. A sector of user data is typically 512 bytes, corresponding to the size of a sector in magnetic disk drives. In one embodiment, each word line of a block is associated with one page. In another embodiment, each word line of a block is associated with 3 pages. In other embodiments, the word lines can be associated with other numbers of pages.

A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. The ECC data can be stored separately from the user data or intertwined with the users data (e.g., to form code words). The use of ECC with storage of data is well known in the art.

A high performance low-complexity coding scheme using an advanced Low Density Parity Check (LDPC) code is one example ECC technology known for use with storing data in non-volatile memories. LDPC codes can be decoded using iterative message passing decoding algorithms. These algorithms operate by exchanging messages between variable and check nodes over the edges of an underlying bipartite graph representing the code. The decoder is provided with initial estimates of the stored bits based on the voltage levels read from the memory cells. These initial estimates are refined and improved by imposing the parity-check constraints that the bits should satisfy as a valid code word. These initial estimates are then updated through exchange of information between the variable nodes representing the code word bits and the check nodes representing parity-check constraints on the code word bits.

The initial estimates used in LDPC decoding include hard bits and soft bits. Hard bits are an estimate of the actual data being stored. For example, hard bits are generally created by sensing the memory cells threshold voltage at the read compare levels. Soft bits are extra information from sensing at voltage levels other than the read compare levels. It is known in the art to use hard bits and soft bits to decode information sensed from memory cells. For example, more information about the LDPC decoding can be found in the following patent documents: U.S. Pat. No. 8,099,652; U.S. Pat. No. 8,059,463; U.S. Patent Application Publication No. 2011/0205823; U.S. Patent Application Publication No. 2007/0283227; U.S. Patent Application Publication No. 2011/0252283; U.S. Pat. No. 7,814,401; U.S. Pat. No. 7,966,546; U.S. Pat. No. 7,966,550; U.S. Pat. No. 7,797,480; U.S. Pat. No. 7,904,793.

Some memory cells are slower to program or erase than others potentially because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

Figure 7:
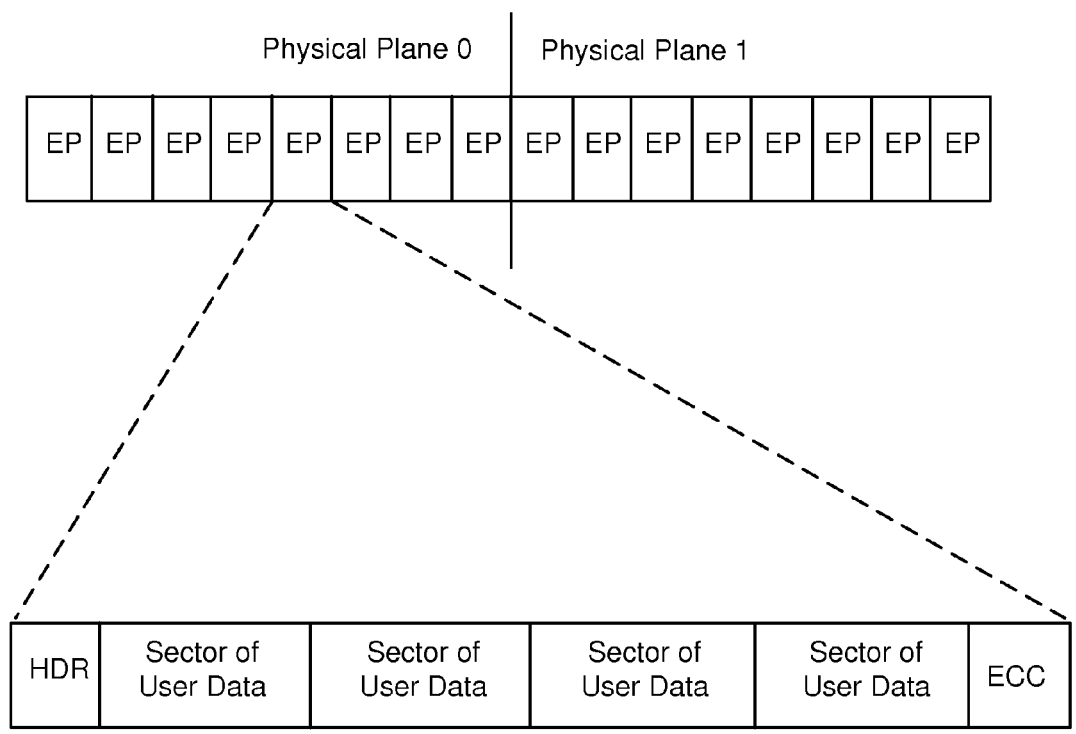
FIG. 7 is a block diagram of the arrangement of data along a word line.

FIG. 7 is a block diagram of the arrangement of data along one word line. In this example, each block (the unit of erase) is divided into two planes (Physical Plane 0 and Physical Plane 1). Each word line includes 8 ECC Pages (EP) in each plane, for a total of sixteen ECC Pages. Each ECC page includes header information (HDR), four sectors of user data and ECC information. In one embodiment, the four sectors of user data are stored as LDPC code words.

At the end of a successful programming process (with verification), the threshold voltages of the memory cells should be within one or more distributions of threshold voltages for programmed memory cells or within a distribution of threshold voltages for erased memory cells, as appropriate.

Figure 8:
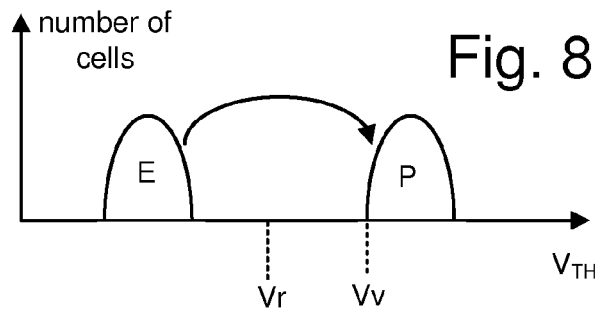
FIG. 8 depicts an example set of threshold voltage distributions and describes a process for programming non-volatile memory.

FIG. 8 illustrates example threshold voltage distributions for the memory cell array when each memory cell stores one bit of data. Other embodiments, however, may use more than one bit of data per memory cell (e.g., such as two, three, or four bits of data per memory cell). FIG. 8 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed to go from E to P. In one embodiment, memory cells in data state E store a logical "1" and memory cells in data state P store a logical "0." In one embodiment, the threshold voltages in E are negative and the threshold voltages in P are positive. FIG. 8 also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv. Note that in one embodiment that store one bit of data per memory cell, all of the bits of data stored in a memory cells connected to one word line in a block is said to be in a single logical page. In some example implementations, data can be programmed or read in logical pages. In system that include ECC pages, one logical page may include multiple ECC pages.

Figure 9:
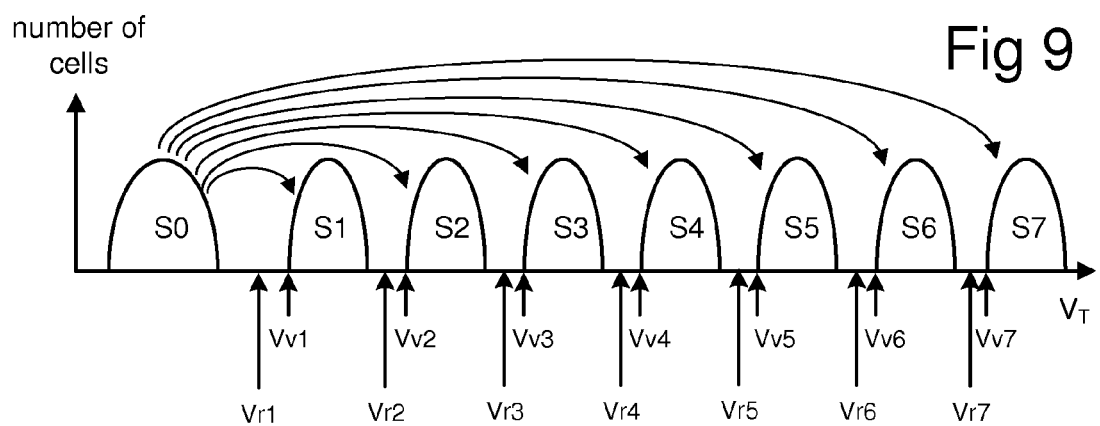
FIG. 9 depicts an example set of threshold voltage distributions and describes a process for programming non-volatile memory.

FIG. 9 illustrates example threshold voltage distributions for the memory cell array when each memory cell stores three bits of data. Other embodiments, however, may use more or less than three bits of data per memory cell (e.g., such as three bits of data per memory cell).

In the example of FIG. 9, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line store data in the same three logical pages of data. In some embodiments, the memory cells connected to a word line can be grouped into different sets of pages (e.g., by odd and even bit lines, or by other arrangements). Note that the logical pages discussed herein are different than ECC Pages (EP) discussed above with respect to FIG. 7. In one example, each of the ECC Pages (EP) can be broken into three logical pages. In another example, each of the three logical pages can be divided into ECC Pages. The term "page" can refer to either a logical page or an ECC page.

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 9.

FIG. 9 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 9 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 9) or verify operation (e.g. see verify target levels Vv1, Vv2, Vv3, Vv4, Vv5, Vv6, and Vv7 of FIG. 9) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 10:
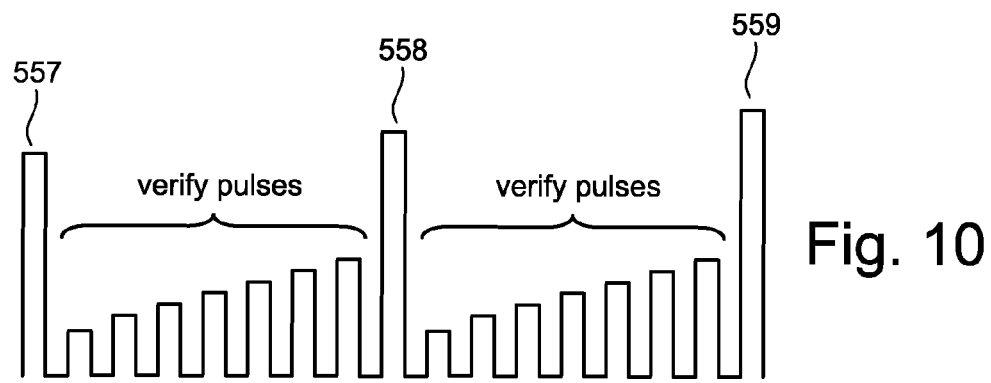
FIG. 10 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 10 shows a portion of a signal applied to the control gates of a plurality of memory cells connected to a common word line. FIG. 10 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 10 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 0 have reached Vv2, there is no reason to verify at Vv7.

FIG. 9 shows a programming process that includes one phase, where all memory cells connected to the same word line are programmed concurrently during that one phase. FIGS. 11A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 11A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 11B. Memory cells being programmed to intermediate state IM are programmed to a target threshold voltage of VvIM.

During the second phase of the programming process of FIGS. 11A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 11C.

As can be seen in FIG. 11C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

Figures 11F, 12:
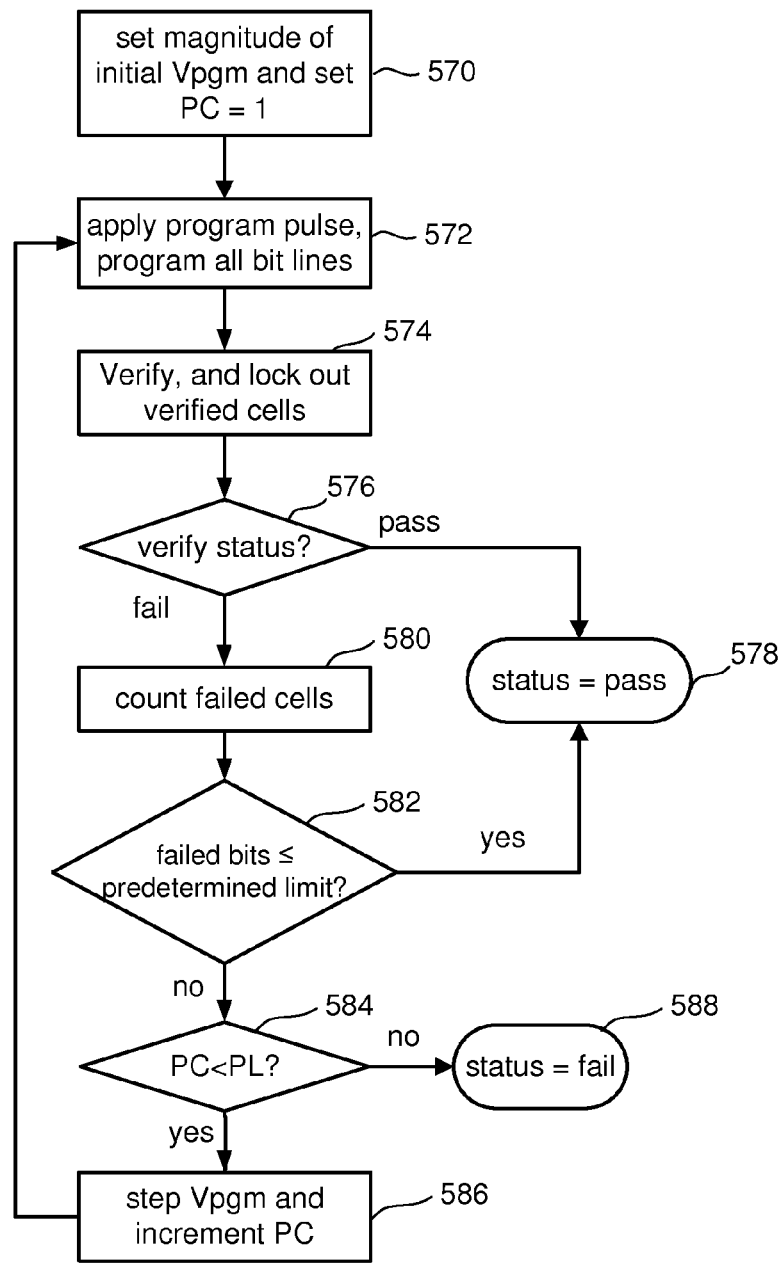
FIG. 11F is a table depicting an example data encoding.
FIG. 12 is a flow chart describing one embodiment of a process for programming non-volatile memory.

In the third phase of programming, each of data states S1-S7 are tightened so that they no longer overlap with neighboring states. This is depicted graphically by FIG. 11D. The final result of the three phrase programming process is depicted in step 11E, which shows data states S0-S7. In some embodiments, data state S0 is wider than data states S1-S7. FIG. 11F shows one example of how data is encoded for the data states of FIGS. 11A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

FIG. 12 is a flow chart describing one embodiment of a process for performing programming on memory cells connected to a common word line to one or more targets (e.g., data states or threshold voltage ranges). The process of FIG. 12 can be performed one or multiple times during the programming of memory cells connected to a word line. For example, the process of FIG. 12 can be used to program memory cells from erased data state E to programmed data state P of FIG. 8; from data state S0 of FIG. 9 to any of data states S1-S7 performing full sequence programming, and any stage of the multi-stage programming process of FIGS. 11A-E.

Typically, the program voltage applied to the control gate during a program operation is applied as a series of program pulses. Between programming pulses are a set of verify pulses to perform verification, as depicted (for example) in FIG. 10. In many implementations, the magnitude of the program pulses is increased with each successive pulse by a predetermined step size. In step 570 of FIG. 12, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state, each ECC page or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 13:
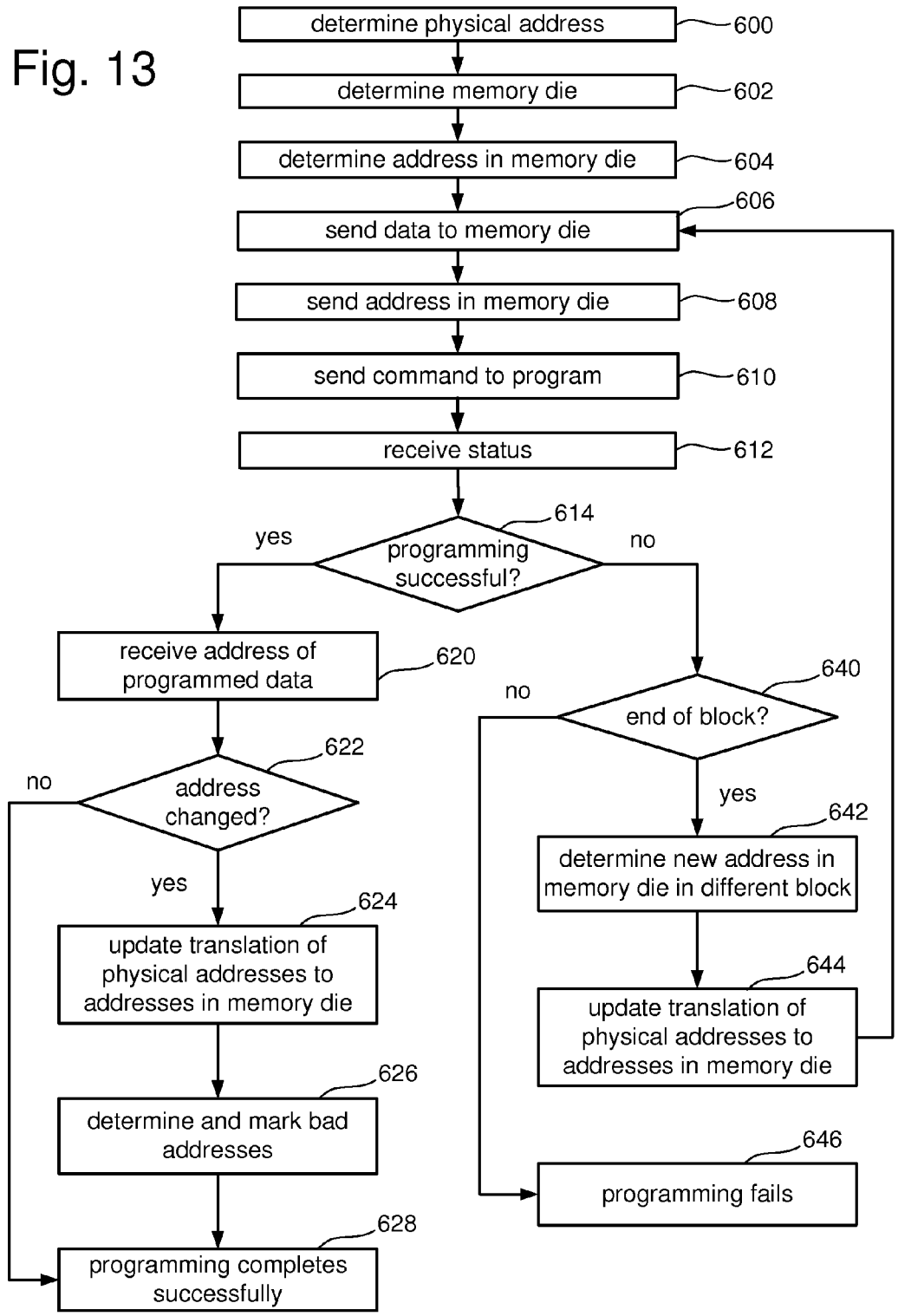
FIG. 13 is a flow chart describing one embodiment of a process for programming performed by a controller.

FIG. 13 is a flowchart describing one embodiment of a process for programming performed by a controller (e.g. controller 160 of FIG. 2). In one example, the process of FIG. 13 can be performed in response to a request to program data from a host. Additionally, controller 160 can determine if it needs to perform programming for other reasons. In step 600 of FIG. 13, controller 160 determines the physical address to use for programming the memory. For example, a logical address (from the host or other entity) can be translated into a physical address in the memory space. In step 602, controller 160 determines which memory die (of one or more memory die 212) the data should be programmed onto. In one embodiment, the data can be programmed to more than one memory die. In step 604, controller 160 determines the address in the memory die to program. This will include doing a translation from the physical address (also known as a system address) to the memory chip address (see Physical to Memory Chip Address Translation 188). In step 606, the data to be programmed is transmitted from controller 160 to the memory die (e.g. see data signals 234 of FIG. 2 communicating between memory interface 158 and one or more memory die 212). In step 608, the address in the memory chip (determined in step 604) is transmitted to the appropriate memory die 212. In step 610, the command to program is transmitted from controller 160 to the appropriate memory die 212. After step 610, the appropriate memory die performs a program operation. After the program operation is completed, controller 160 receives a report of the status of the program operation in step 612. In one embodiment of step 612, the memory die includes a status register, such as part of status register 497 (see FIG. 5), and controller 160 continuously polls the status register in order to determine the status of the program of the operation. In another embodiment of step 612, memory die 212 actively transmits the status to controller 160 (e.g. see data signals 234 of FIG. 2 communicating between memory interface 158 and one or more memory die 212).

Note that in one embodiment, the address determined in step 604 is for a page. In one example implementation, the addressed page is an ECC page. In another embodiment, the addressed page is a logical page. When the address determined in step 604 is for a page, then the data transmitted in step 606 is a page of data. If the addressed page is an ECC page, then the data is transmitted for an ECC page. If the addressed page is a logical page, then the data is transmitted for a logical page.

Sometimes, the programming fails. That is, a program fault occurs. A program fault is an error in the programming process. There are a wide range of errors that can occur from intermittent errors to permanent errors, and from small errors (ie just missing the manufacturer's specification) to large errors. In some cases, the targeted memory cells can still be programmed, just not to the desired level of the programming currently requested. These errors can occur because a word line is broken, there is a short between word lines, one or more memory cells are damaged, or other reasons. Looking back at FIG. 12, one example of a program fault is when the number of iterations of the method depicted in FIG. 12 exceeds the predetermined limit. That is, the programming operation has been performed for too long, without reaching a satisfactory conclusion. In the example of FIG. 12, there is a program fault at the point when it is no longer true that PC<PL (see step 584). In such a case, the appropriate status register 497 (see FIG. 5) is updated to indicate the program fault. In prior system, if there is a program fault, the data, address and command had to be retransmitted from the controller to one or more memory die in order to retry programming. That process wastes time. It is therefore proposed that when a program fault occurs the memory die automatically (on its own initiative, without further instruction or command from another component or controller) advance the address to the next available word line, page or other unit in the same block (or other unit of storage) and retry the programming without receiving a retransmission of the data and without receiving the new (adjusted) programming address from the controller 160 or any other source external to that memory die. Thus, in one embodiment, the memory die may retry the programming multiple times, to successive die addresses until finally the programming is successful.

In one alternative embodiment, when choosing an address to retry the programming, the memory die need not choose the next available word line, page or other unit in the same block. Rather, the memory die may choose a different word line, page or other unit in the same block.

If the programming was successful (see step 614), then controller 160 accesses the address used to successfully program the data in step 620. In one embodiment, data latches/shift registers 494 (see FIG. 5) will include a register for storing the address that failed and the address that was successful. In another embodiment, process 492 (FIG. 5) can include internal registers to store the address that failed and the address that was successful. Controller 160 can poll those registers to gain that information or they can be automatically reported by the memory die upon successful completion of the programming.

In step 622, controller 160 determines whether the address is changed. That is, whether the address used for the successful programming has changed from the address initially provided by the controller 160. If there has been no change in address, that means that the initial or original programming command was successful; therefore, the programming has completed successfully (step 628).

If, however, there is a change in the address (e.g. the final address of the successful programming does not match the initial address sent from controller 160), then the process will continue as step 624. In this case, controller 160 knows that the original programming resulted in a program fault and the memory chip automatically chose a new address for programming. Therefore, in step 624, controller 160 updates the translation of the physical address (one example of a system address) to the address in the memory die to reflect a translation between the physical address determined in step 600 and the address used to successfully program the data. In one embodiment, this includes updating a table (see Physical to Memory Chip Address Translation 188). Additionally, the controller can mark the address that resulted in the program fault as a bad address so that the controller does not use that bad address for future programming In step 626, controller 160 determine the bad addresses associated with program faults for the current programming process. In one example, after the first program fault, the second retry of programming will work; therefore, there will only be one bad address to mark. In other example, there could be multiple consecutive program faults and, therefore, multiple addresses to mark as bad addresses. In step 626, all bad addresses are marked. For example, by looking at the address that was successful and the initial address associated with the command to program, the initial unsuccessful address and any addresses in between the initial unsuccessful address and the successful address can be determined to be marked. The example assumes the embodiment where retries of the programming process by the memory dies is performed on consecutive addresses (e.g., consecutive word lines, consecutive pages, or other consecutive units). After marking the addresses, the program process has completed (step 628).

If, in step 614, it is determined that the status of the programming operation was not successful, then controller 160 will determine whether the address just recently tried was at the end of a block (step 640). In one embodiment, the automatic retry and incrementing of addresses performed by the memory chip will not cross a memory block. In such a case when a memory block border has been reached, the program fault will be reported. If the address associated with the Program Fault is at the end of a block, then controller 160 will choose a new block by determining a new address in a different block in step 642. The translation between the physical address (system address) and the address to memory that will be updated to the address chosen in the new/different block in step 644 and the process will continue back at step 606, where the data, address and commands will be sent to the appropriate memory die. If, after receiving a program fault, controller 160 determines that it was not at the end of a block (step 640), then there is some other problem and the programming operation will fail (step 646).

Figure 14:
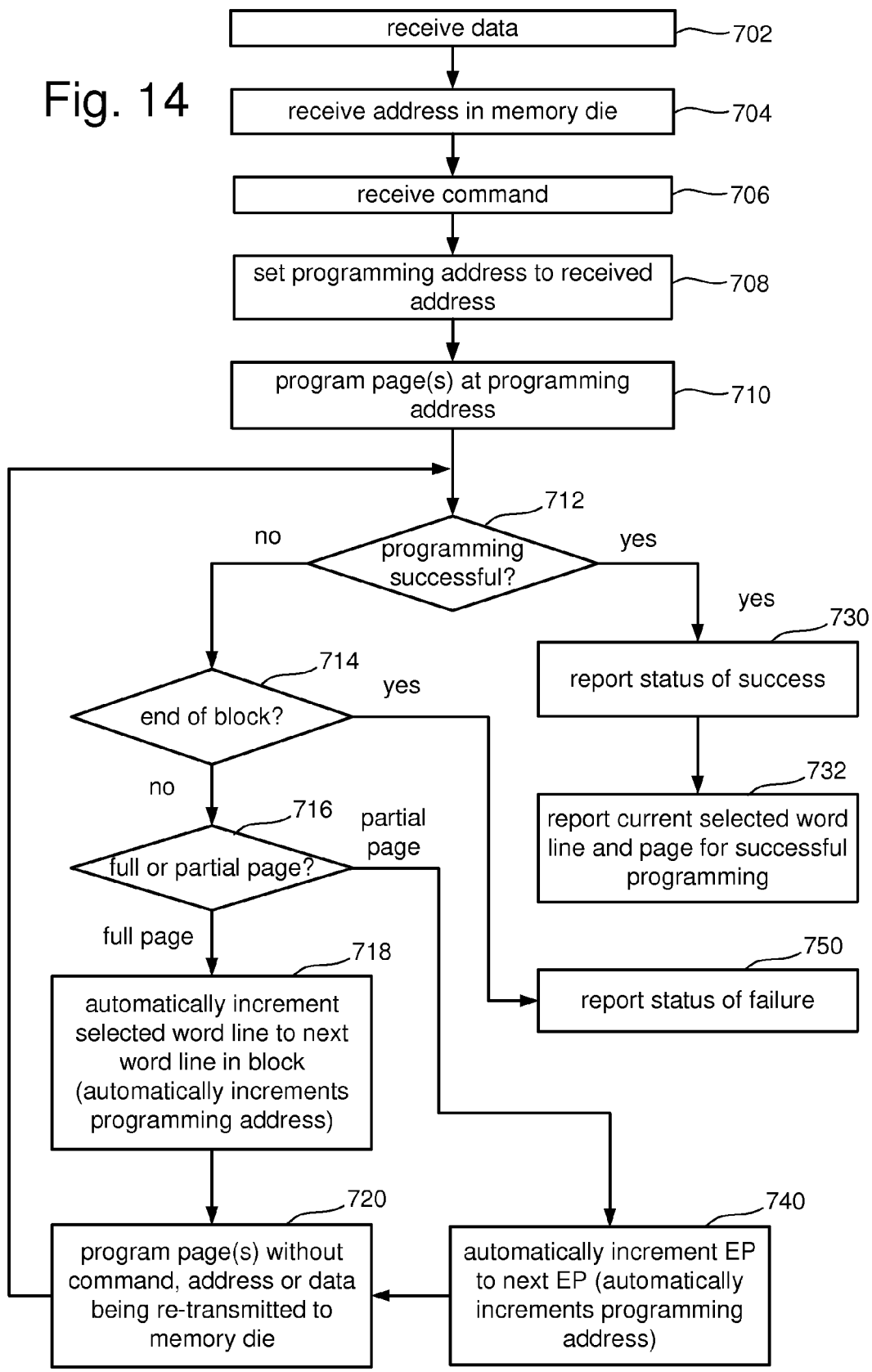
FIG. 14 is a flow chart describing one embodiment of a process for programming performed by a memory die.

FIG. 14 is a flowchart describing one embodiment of a process for programming that is performed by a memory die (e.g., any of memory die 212 of FIG. 2) in conjunction with the process of FIG. 13 being performed by controller 160. In step 702 of FIG. 14, the memory die will receive data for programming. For example, step 702 may be performed by the memory die in response to controller sending the data in step 606 of FIG. 13 13. In step 704 of FIG. 14, the memory die will receive an address in the memory die, which can be performed in response to step 608 of FIG. 13. In step 706, the memory die will receive a command to program the data received at the address in the memory die received in step 704. In one example, step 706 performed in response to step 610 of FIG. 13 being performed by the controller. Note that the data, address and command can be sent in other orders than as depicted in FIG. 14.

In step 708, the memory die sets the programming address to be the received address from controller 160. In step 710, the memory die programs one or more pages (logical pages or ECC pages) based on the programming address. Step 710 can for example, include performing the process of FIG. 12 to implement any of the programming schemes described by FIGS. 8, 9, 10 and 11A through F. Additionally, other programming techniques can also be implemented. The programming of step 710 can either be a successful programming operation or a failure (also known as a program fault). If the programming is not successful (i.e. program fault), then the memory die will determine whether it is at the end of a block (the boundary of a block) in step 714. If at the end of the block, the memory die will report a failure as the final status of the programming process in step 750. That is, the status registers 497 will be updated to indicate a program fault or other type of program failure.

If it is determined, in step 714, that the address currently being used to program was not at the end of a block, then in step 716 it is determined whether the programming process was programming a full page of data or partial page of data. The page being referred to as full or partial is the logical page, as discussed above. In an embodiment where there is only one logical page stored per word line per block, if all the memory cells connected to a word line in a plane are being programmed then it is a full-page programming. If it is a full-page programming, then in step 718, the system will automatically increment the programming address from the selected word line to the next word line in the same block. Looking back at FIG. 6, some memory systems will program from the source side to the drain side. That is, first WL0 will programmed, then WL1 will be programmed, then WL2 will be programmed, etc. If a program fault happens while programming WL1, then in step 718 the memory die will increment the programming address from WL1 to WL2. In other embodiments, step 718 can include the memory die changing the programming address to a new address that is not the next address in the address space; for example, the memory die may choose another open address in the same block. An open address is an address for a location that is available to be programmed.

In step 720, the memory die retries the programming at the new address. Thus, the memory die will reprogram the data without a command, address or data being retransmitted from the controller to the memory die or from any other source external to the memory die. After programming step 720, the process loops back to 712 to determine whether the programming was successful.

If it is determined at step 716 that the memory die is performing a partial-page programming (e.g., programming less than a full logical page), then at step 740 the memory die increments the programming address to the next partial page in the same block. In one embodiment, the smallest unit of programming, when partial-page programming, is the ECC page. In such an embodiment, step 740 includes automatically incrementing the programming address to the next EP page in the same block. After incrementing to the next EP page in step 740, the process continues at step 720, as discussed above. In other embodiments, step 740 can include the memory die changing the programming address to a new address that is not the next page in the address space; for example, the memory die may choose another open page in the same block.

If it is determined at step 712 that the programming was successful, then the memory die reports the successful programming status in step 730. In one embodiment, that includes updating the status registers 497 so that the controller can poll the updated status registers. In another embodiment, step 740 includes the memory die actively reporting status in a message transmitted to controller 160. Additionally, memory die 212 identifies the address used to successfully program the data. Therefore, if the memory die automatically changed the programming address after a program fault (e.g., step 718), then the updated address is identified by the memory die. For example, the memory die may store the new address in a register or transmit the address in a message to the controller or other entity.

Figure 15:
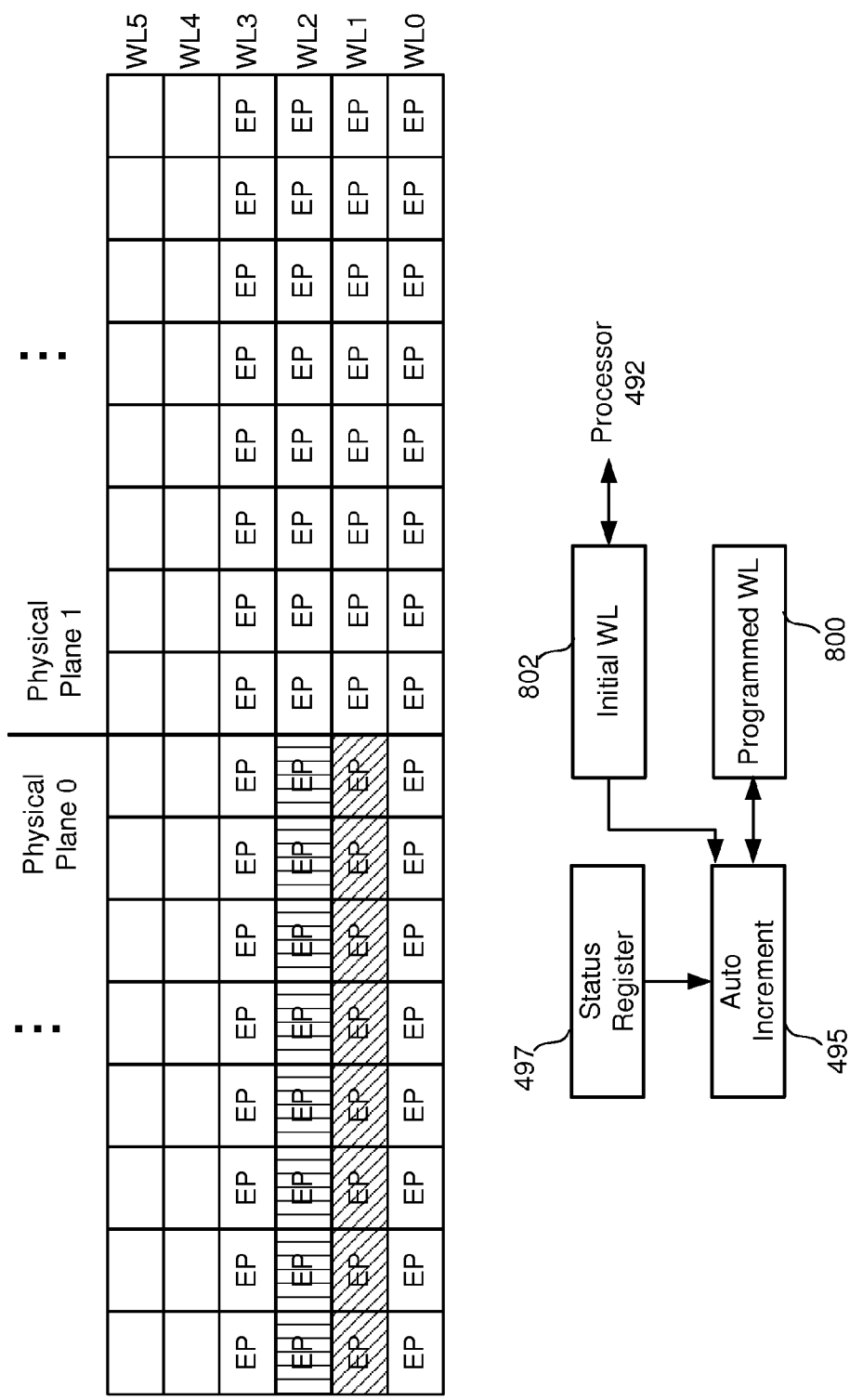
FIG. 15 is a block diagram depicting the arrangement of data along a subset of word lines.

FIG. 15 provides an example of the operation of the flowcharts of FIGS. 13 and 14. FIG. 15 shows a portion of a memory array that spans two planes (physical plane 0 and physical plane 1). A portion of one block for each plane is depicted. The portion of the blocks includes six word lines: WL0, WL1, WL2, WL3, WL4, and WL5. In this example, each block stores one logical page per word line, an empty rectangle indicates an ECC page (EP) that has not been programmed, a rectangle that says EP and has no shading is a rectangle that was programmed and experienced no program fault, a rectangle that says EP and has angled shading was attempted to be programmed but experienced a program fault, and a rectangle that has horizontal shading is an ECC page that is programmed successfully after an automatic retry by the memory die 212 (with the memory die 212 automatically updating the address in response to a program fault). In this example, the memory die was performing full-page programming and attempted to program the full logical page (all ECC pages on word line WL1 and physical plane 0). A program fault occurred. Therefore, memory die 212 automatically incremented the programming address to address word line WL2 in physical plane 0. After updating the programming address, memory die 212 automatically programmed the memory cells connected to word line WL2 to successfully program the data without receiving a new request to program, a new transmission of data or a new address from controller 160 or any other entity external to the memory chip.

FIG. 15 also shows status register 497 (see FIG. 5), automatic increment circuit 495 (see FIG. 5), new address register 800 and initial address 802. In the embodiment of FIG. 15, final address register 800 stores the identity of the word line (or address of the word line) that was used to successfully program the data. Initial address register 802 stores the word line (or address) of the word line initially commanded to be used for programming by controller 160. In the example of FIG. 15, when receiving the address to program from the controller, that address will be stored in register 802 after the first program fault, automatic increment circuit 495 will read the initial word line from register 802, increment the word line address to the next word line in the same block, and store that next word line address in the new address register 800. In one embodiment, registers 800 and 802 are part of data latch/shift registers 494 (FIG.

5). In another embodiment, registers 800 and 802 are internal to processor 492. In yet another embodiment, registers 800 and 802 are external to the circuit of FIG. 5 but otherwise within memory die 212.

Figure 16:
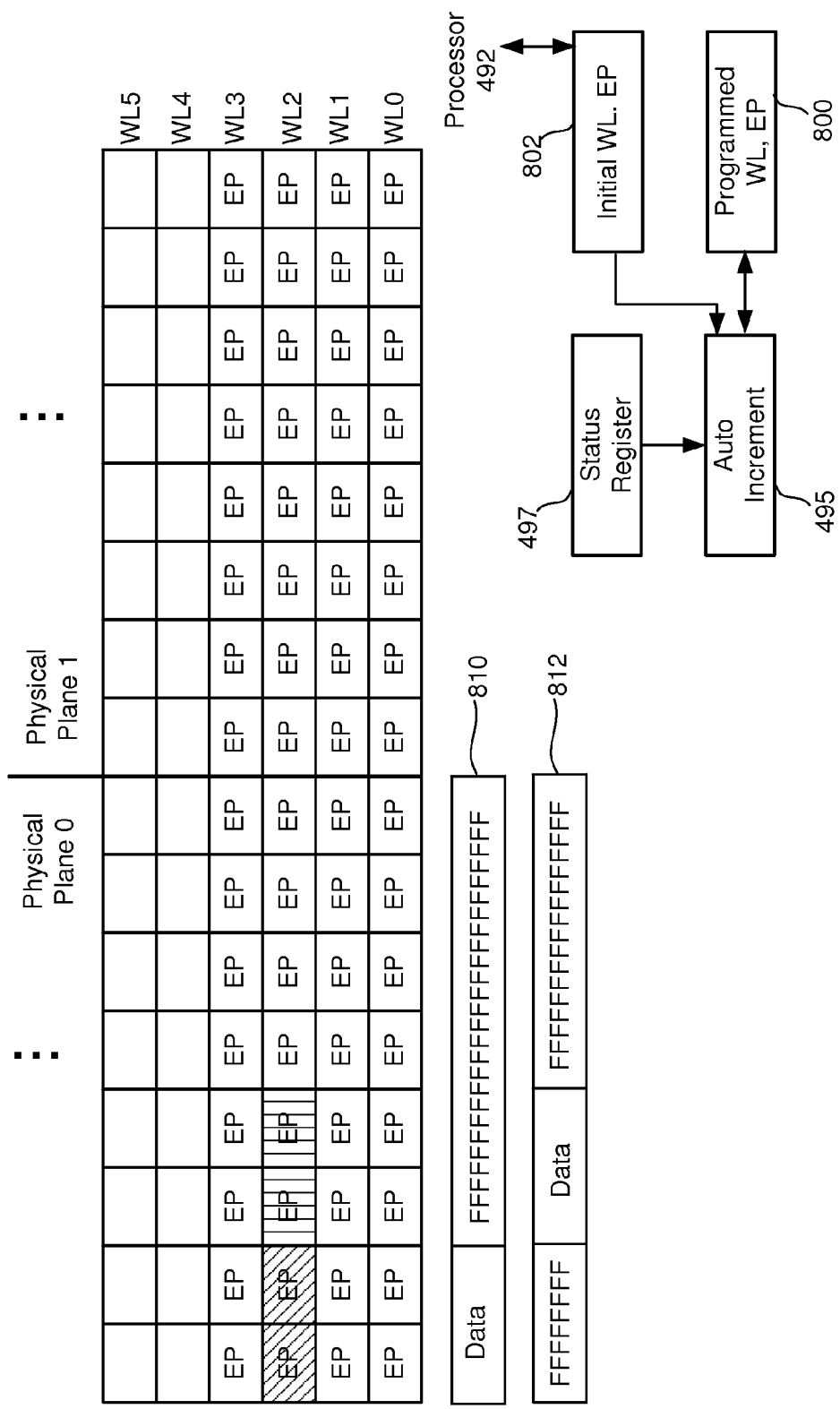
FIG. 16 is a block diagram depicting the arrangement of data along a subset of word lines.

FIG. 16 provides another example of the programming process according to the flowcharts of FIGS. 13 and 14, for the case of partial-page programming. That is, not all of the ECC pages along the word line will be programmed because only a portion of a logical page is programmed. FIG. 16 shows status register 497, automatic increment circuit 495, new address register 800 and initial address 802. FIG. 16 also shows register contents 810 and register contents 812. Register contents 810 shows the contents of a shift register from Data Latches/Shift Registers 494 (see FIG. 5) at a first time and register contents 812 shows the contents of a shift register from Data Latches/Shift Registers 494 at a second time.

In the example of FIG. 16, the first two ECC pages were attempted to be programmed along word line WL2 of the block on Physical Plane 0. However, a program fault occurred. Therefore, status register 497 was updated to indicate the program fault. As a result, automatic increment circuit 495 incremented the initial word line and ECC page address (the programming address) to a new word line and ECC page address in the same block and stored that new updated address in new address register 800. In one embodiment, the new address is the next ECC page after the ECC page(s) that caused the program fault. Memory die 212 stored the data in a register in Data Latches/Shift Registers 494 as per the form indicated by block 810 so that the data was aligned with the appropriate ECC pages and all 1 s (Hexadecimal F) were aligned with pages not to be programmed. When the programming is to be retried at the new address (same word line, next set of EPs), the data is shifted, as depicted in block 812. Both 810 and 812 depict the same shift register that is part of data latches/shift registers 494. Therefore, processor 492 will shift the data in response to a status of a program fault so that the data aligns with the next set of ECC pages. As can be seen, the third and fourth ECC pages of word line WL2 and physical plane 0 were programmed successfully.

As can be seen, the technique for programming described above only requires data transfer once. Even if there is a program fault, the data need not be transferred multiple times. Therefore, performance will be improved with the memory system that has one or more faulty memory cells or faulty word lines. Since data is not transmitted multiple times, the scrambling and ECC only need to be computed once. The data does not need to be re-scrambled or re-mapped, etc. As such there is no data recovery mechanism that needs to move data to another block. This allows the firmware programming the controller to be optimized for space and speed as compared to having a more complex and slower program fault handling technique.

One embodiment includes an apparatus, comprising; a plurality of memory cells arranged in blocks on a memory die; and one or more control circuits on the memory die and in communication with memory cells, the one or more control circuits are configured to attempt to program first data at a programming address in a first block of the memory die and determine that programming of the first data at the programming address fails, the one or more control circuits are configured to automatically change the programming address to a new address within the first block in response to determining that programming of the first data at the first address fails and program the first data at the new address in the first block, the one or more control circuits are configured to report successful programming of the first data and identify the new address as the programming address of the first data.

One embodiment includes a method, comprising: receiving first data and a request to program the first data; attempting to program the first data at a programming address in a first block, the programming address is associated with the request to program the first data; determining that programming of the first data at the first address failed; automatically changing the programming address to a new address in the first block and programming the first data at the new address in the first block; and reporting successful programming of the first data and identifying the new address as the programming address of the first data.

One embodiment includes a non-volatile storage system, comprising; a controller configured to transmit data and an initial address in conjunction with a request to program the data; and a memory die comprising a plurality of memory cells and one or more control circuits, the memory die is in communication with the controller, the memory die is configured to receive the data and initial address in conjunction with the request to program the data from the controller, the one or more control circuits are configured to attempt to program the data to the memory cells at the initial address and determine that programming of the data at the initial address fails, the one or more control circuits are configured to automatically identify a new address in the memory die and program the data to the new address on the memory, the one or more control circuits are configured to report successful programming the data to the controller and identify the new address for the successfully programmed data.

Note that the use of terms such as first, second and third in the claims is not intended to designate order or location. Rather, those terms are used as labels to separately identify items.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles and practical application of certain embodiments, to thereby enable others skilled in the art to best utilize the invention in various embodiments and with various modifications as are suited to the particular use contemplated. It is intended that the scope be defined by the claims appended hereto.

We claim:

1. An apparatus, comprising;
a plurality of memory cells arranged in blocks on a memory die; and
one or more control circuits on the memory die and in communication with memory cells, in response to a request from a component external to the memory die the one or more control circuits are configured to attempt to program first data at a programming address in a first block of the memory die and determine that programming of the first data at the programming address fails, the one or more control circuits are configured to automatically change the programming address to a new address within the first block in response to determining that programming of the first data at the first address fails and program the first data at the new address in the first block, the one or more control circuits are configured to report successful programming of the first data including reporting to the component external to the memory die the new address as the programming address of the first data.

2. The apparatus of claim 1, wherein:
the one or more control circuits are configured to program the first data at the new address in the first block using the first data as originally received by the memory die prior to determining that programming of the first data at the first address fails.

3. The apparatus of claim 1, wherein:
the one or more control circuits include an automatic increment circuit on the memory die; and
in response to the one or more control circuits determining that programming of the first data at the programming address fails, the automatic increment circuit automatically determines the new address.

4. The apparatus of claim 1, wherein:
the one or more control circuits include an automatic increment circuit, a programming status register connected to the automatic increment circuit and a new address register, all on the memory die;
the programming status register is configured to store an indication that programming of the first data at the programming address fails;
the automatic increment circuit automatically determines the new address based on the indication stored in the programming status register; and
the new address register is updated by the automatic increment circuit to store an indication of the new address.

5. The apparatus of claim 1, wherein:
the one or more control circuits include an automatic increment circuit and an address register in communication with the automatic increment circuit, both on the memory die;
the automatic increment circuit automatically changes the programming address to the new address by incrementing the programming address to a next page in the first block; and
the address register is updated to store an indication of the new address.

6. The apparatus of claim 1, wherein:
prior to the automatic change, the programming address refers to a particular page on a particular word line in the first block;
the one or more control circuits include an automatic increment circuit, an address register in communication with the automatic increment circuit and a shift register configured to store the first data, all on the memory die;
the automatic increment circuit automatically changes the programming address to the new address by incrementing the programming address to a next page on the particular word line in the first block, the next page being adjacent to the particular page; and
the shift register is configured to automatically shift the first data from a first position corresponding to the particular page to a second position corresponding to the next page subsequent to determining that programming of the first data at the first address fails and prior to programming the first data at the new address.

7. The apparatus of claim 1, wherein:
the one or more control circuits include an automatic increment circuit on the memory die; and
the automatic increment circuit automatically changes the programming address to the new address by incrementing the programming address to a next word line in the first block.

8. The apparatus of claim 1, wherein:
in response to a request from the component external to the memory die the one or more control circuits are configured to attempt to program second data at a second address in the first block of the memory die and determine that programming of the second data at the second address fails, the one or more control circuits are configured to determine that the second address is at an end of the first block and report to the component external to the memory die that the programming of the second data at the second address is a failure in response to determining that the second address is at an end of the first block.

9. The apparatus of claim 1, wherein:
the memory cells are part of a monolithic three dimensional memory structure.

10. The apparatus of claim 1, wherein:
prior to the automatic change, the programming address refers to a particular page on a particular word line in the first block;
the one or more control circuits include a shift register configured to store the first data;
the one or more control circuits are configured to automatically change the programming address by changing from the particular page to a next page, the new address refers to the next page; and
the shift register is configured to automatically shift the first data from a first position corresponding to the particular page to a second position corresponding to the next page subsequent to determining that programming of the first data at the first address fails and prior to programming the first data at the new address.

11. A method, comprising:
receiving, at a die, first data and a request to program the first data from a component external to the die;
attempting to program the first data at a programming address in a first block, the programming address is associated with the request to program the first data;
determining that programming of the first data at the first address failed;
at the die, changing the programming address to a new address in the first block and programming the first data at the new address in the first block; and
reporting successful programming of the first data and identifying the new address as the programming address of the first data to the component external to the die.

12. The method of claim 11, wherein:
the die is a memory die; and
the memory die programs the first data at the new address in the first block using the first data as received prior to the determining that programming of the first data at the first address failed.

13. The method of claim 11, wherein:
the attempting to program the first data and the determining that programming of the first data at the first address failed are performed by the die;
the die is a memory die; and
the memory dies automatically changes the programming address to the new address based on its own calculation of the new address.

14. The method of claim 11, wherein:
prior to changing the programming address, the programming address corresponds to a particular page on a particular word line in the first block; and
the changing the programming address to the new address in the first block includes incrementing the programming address from the particular page on the particular word line to a next page on the particular word line in the first block.

15. The method of claim 14, wherein the die is a memory die, the method further comprising:
automatically shifting the first data in a shift register on the memory die from a first position corresponding to the particular page to a second position corresponding to the next page subsequent to determining that programming of the first data at the first address failed and prior to programming the first data at the new address.

16. The method of claim 11, wherein:
the changing the programming address to the new address in the first block includes incrementing the programming address to a next word line.

17. The method of claim 11, further comprising:
receiving second data, a second address and a request to program the second data;
attempting to program the second data at the second address in the first block;
determining that programming of the second data at the second address failed;
determining that the second address is at an end of the first block; and
re-programming the second data to a different address in a different block.

18. The method of claim 11, wherein:
the programming the first data at the new address includes programming the first data into memory cells that comprise a monolithic three dimensional memory structure.

19. A non-volatile storage system, comprising:
a controller configured to transmit data and an initial address in conjunction with a request to program the data; and
a memory die comprising a plurality of memory cells and one or more control circuits, the memory die is in communication with the controller, the memory die is configured to receive the data and initial address in conjunction with the request to program the data from the controller, the one or more control circuits are configured to attempt to program the data to the memory cells at the initial address and determine that programming of the data at the initial address fails, the one or more control circuits are configured to identify a new address in the memory die and program the data to the new address on the memory, the one or more control circuits are configured to report successful programming of the data to the controller and identify the new address for the successfully programmed data to the controller, the controller is configured to mark the initial address as a bad address and create a translation of a system address to the new address in response to the receiving the identification of the new address from the memory die.

20. The non-volatile storage system of claim 19, wherein:
the one or more control circuits include an automatic increment circuit, a programming status register connected to the automatic increment circuit and a new address register;
the programming status register is configured to store an indication that programming of the data at the initial address fails;
the automatic increment circuit automatically determines the new address based on the indication stored in the programming status register; and
the new address register is updated by the automatic increment circuit to store an indication of the new address.

21. The non-volatile storage system of claim 19, wherein:
the plurality of memory cells are part of a monolithic three dimensional memory structure.

\* \* \* \* \*